(12) United States Patent
Polansky et al.

(10) Patent No.: US 7,178,004 B2
(45) Date of Patent: Feb. 13, 2007

(54) MEMORY ARRAY PROGRAMMING CIRCUIT AND A METHOD FOR USING THE CIRCUIT

(76) Inventors: Yan Polansky, 17/10 Arlozorov Street, Ramat Gan (IL); Avi Lavan, 18 Ha'snunit, Ashkelon 78382 (IL)

( * ) Notice: Subject to any disclaimer, the term of this patent is extended or adjusted under 35 U.S.C. 154(b) by 455 days.

(21) Appl. No.: 10/653,388

(22) Filed: Sep. 3, 2003

(65) Prior Publication Data
US 2004/0153621 A1 Aug. 5, 2004

Related U.S. Application Data

(60) Provisional application No. 60/443,871, filed on Jan. 31, 2003.

(51) Int. Cl.
*G06F 12/02* (2006.01)
(52) U.S. Cl. .................... 711/202; 711/103
(58) Field of Classification Search ............... 711/103, 711/202; 710/52; 365/185.33
See application file for complete search history.

(56) References Cited

U.S. PATENT DOCUMENTS

| | | | |
|---|---|---|---|
| 3,895,360 A | 7/1975 | Cricchi et al. | |
| 4,527,257 A | 7/1985 | Cricchi | |
| 5,104,819 A | 4/1992 | Freiberger et al. | |
| 5,172,338 A | 12/1992 | Mehrotra et al. | |
| 5,293,563 A | 3/1994 | Ohta | |
| 5,295,108 A | 3/1994 | Higa | |
| 5,345,425 A | 9/1994 | Shikatani | |
| 5,349,221 A | 9/1994 | Shimoji | |
| 5,350,710 A | 9/1994 | Hong et al. | |
| 5,359,554 A | 10/1994 | Odake et al. | |
| 5,393,701 A | 2/1995 | Ko et al. | |
| 5,394,355 A | 2/1995 | Uramoto et al. | |
| 5,412,601 A | 5/1995 | Sawada et al. | |
| 5,418,743 A | 5/1995 | Tomioka et al. | |

(Continued)

FOREIGN PATENT DOCUMENTS

EP 0693781 1/1996

(Continued)

OTHER PUBLICATIONS

Roy, Anirban *"Characterization and Modeling of Charge Trapping and Retention in Novel Multi-Dielectic Nonvolatile Semiconductor Memory Device,"* Doctoral Dissertation, Sherman Fairchild Center, Department of Computer Science and Electrical Engineering, pp. 1-35, 1989.

(Continued)

*Primary Examiner*—Hiep T. Nguyen
(74) *Attorney, Agent, or Firm*—Eitan Law Group

(57) ABSTRACT

A multi-level cell (MLC) memory array may be programmed using a programming circuit having a binary input register to store data to be input into the MLC array and a register to store a programming vector, where each element in the programming vector corresponds to a charge storage region of an MLC in the array. A controller may map pairs of bits from the input register to elements in the programming vector such that mapping a pair of bits to an element of the programming vector may set the vector element to a "program" value if the pair of bits corresponds to at least one specific program state associated with the programming vector.

27 Claims, 5 Drawing Sheets

U.S. PATENT DOCUMENTS

| | | | |
|---|---|---|---|
| 5,422,844 A | 6/1995 | Wolstenholme et al. |
| 5,424,978 A | 6/1995 | Wada et al. |
| 5,434,825 A | 7/1995 | Harari |
| 5,440,505 A | 8/1995 | Fazio et al. |
| 5,450,341 A | 9/1995 | Sawada et al. |
| 5,450,354 A | 9/1995 | Sawada et al. |
| 5,496,753 A | 3/1996 | Sakurai et al. |
| 5,523,972 A | 6/1996 | Rashid et al. |
| 5,537,358 A | 7/1996 | Fong |
| 5,563,823 A | 10/1996 | Yiu et al. |
| 5,623,438 A | 4/1997 | Guritz et al. |
| 5,636,288 A | 6/1997 | Bonneville et al. |
| 5,689,459 A | 11/1997 | Chang et al. |
| 5,726,946 A | 3/1998 | Yamagata et al. |
| 5,768,193 A | 6/1998 | Lee et al. |
| 5,812,449 A | 9/1998 | Song |
| 5,812,457 A | 9/1998 | Arase |
| 5,892,710 A | 4/1999 | Fazio et al. |
| 5,903,031 A | 5/1999 | Yamamda et al. |
| 5,926,409 A | 7/1999 | Engh et al. |
| 5,946,258 A | 8/1999 | Evertt et al. |
| 5,949,714 A | 9/1999 | Hemink et al. |
| 5,969,993 A | 10/1999 | Takeshima |
| 6,034,896 A | 3/2000 | Ranaweera et al. |
| 6,064,591 A | 5/2000 | Takeuchi et al. |
| 6,075,724 A | 6/2000 | Li et al. |
| 6,081,456 A | 6/2000 | Dadashev |
| 6,118,692 A | 9/2000 | Banks |
| 6,147,904 A | 11/2000 | Liron |
| 6,157,570 A | 12/2000 | Nachumovsky |
| 6,169,691 B1 | 1/2001 | Pasotti et al. |
| 6,181,605 B1 | 1/2001 | Hollmer et al. |
| 6,205,056 B1 | 3/2001 | Pan et al. |
| 6,215,148 B1 | 4/2001 | Eitan |
| 6,240,032 B1 | 5/2001 | Fukumoto |
| 6,240,040 B1 | 5/2001 | Akaogi et al. |
| 6,292,394 B1 | 9/2001 | Cohen et al. |
| 6,304,485 B1 | 10/2001 | Harari et al. |
| 6,331,950 B1 | 12/2001 | Kuo et al. |
| 6,396,741 B1 | 5/2002 | Bloom et al. |
| 6,490,204 B2 | 12/2002 | Bloom et al. |
| 2002/0132436 A1 | 9/2002 | Ellyahu et al. |
| 2002/0191465 A1 | 12/2002 | Maayan et al. |

FOREIGN PATENT DOCUMENTS

WO    WO 96/25741    8/1996

OTHER PUBLICATIONS

Bude et al., "*EEPROM/Flash Sub 3.0V Drain -Source Bias Hot Carrier Writing*", IEDM 95, pp. 989-992.

Bude et al., "*Modeling Nonequilibrium Hot Carrier Device Effects*", Conferences of Insulator Specialists of Europe, Sweden, Jun. 1997.

Lin et al., "*Novel Source-Controlled Self-Verified Programming for Multilevel EEPROM's*", IEEE Transactions on Electron Devices, vol. 47, No. 6, Jun. 2000, pp. 1166-1174.

Shor et al., U.S. Appl. No. 10/354,050, filed Jan. 30, 2003.

MEMORY ARRAY PROGRAMMING CIRCUIT AND A METHOD FOR USING THE CIRCUIT

CROSS-REFERENCE TO RELATED APPLICATION

The present application claims priority from U.S. provisional patent application Ser. No. 60/443,871, filed Jan. 31, 2003, which is hereby incorporated by reference in its entirety.

FIELD OF THE INVENTION

The present invention generally relates to the field of non-volatile memory ("NVM") cells. More specifically, the present invention relates to a method and a system for using a programming register for the programming of multi-level memory cells ("MLC").

BACKGROUND OF THE INVENTION

Non-volatile memory ("NVM") cells may come in a large variety of structures, including but not limited to Polysilicon floating gate and Nitride Read Only Memory ("NROM"). NVM cells are generally operated (e.g. programmed, read, and erased) using one or more reference cells. Each of the one or more reference cells may be compared against a memory cell being operated in order to determine a condition or state of the memory cell being operated. As is well known, an NVM cell's state may be defined and determined by its threshold voltage, the gate to source voltage at which the cell begins to significantly conduct current. Different threshold voltage ranges are associated with different states, and a NVM cell's threshold voltage level is correlated to the amount of charge stored in a charge storage region of the cell.

Generally, in order to determine whether an NVM cell is at a specific state, for example erased, programmed, or programmed at one of multiple possible program states within a multi-level cell ("MLC"), the cell's threshold level is compared to that of a reference cell whose threshold level is preset at a voltage level associated with the specific state being tested for. Comparing the threshold voltage of an NVM cell to that of a reference cell is often accomplished using a sense amplifier. Various techniques for comparing an NVM's threshold voltage against those of one or more reference cells, in order to determine the state(s) of the NVM's cells, are well known.

When programming an NVM cell to a desired state, after each programming pulse, the NVM cell's threshold voltage may be compared against a reference cell having a reference threshold voltage set at a voltage level defined as the "program verify" level for the given program state. The reference cell with a threshold voltage set at a voltage level defined as a "program verify" level for the given state may be compared to the threshold voltage of the cell being programmed (also referred to as being charged) in order to determine whether a charge storage area or region of the cell being programmed has been sufficiently charged so as to be considered "programmed" at the desired state.

If after a programming pulse has been applied to a cell, it has been determined that a cell has not been sufficiently charged in order for its threshold voltage to be at or above a "program verify" level (i.e. the threshold voltage of the relevant reference cell) associated with the target program state, the cell is typically hit with another programming pulse to try to inject more charge into its charge storage region. Once a cell's threshold value reaches or exceeds the "program verify" level to which it is being programmed, no further programming pulse should be applied to the cell.

Typically, a group of cells in an MLC array are programmed at the same time. Sometimes all the cells of a set being programmed are being programmed to the same program state, in other cases, a portion of the set being programmed is programmed to one program state while another portion of the set is programmed to a second state.

Since not all cells have the same susceptibility to being programmed, cells may not program at the same rate. Some cells reach a target program state before other cells in the same set of cells that are being programmed together. As a cell reaches a target program state, the cell may be masked and may not receive any more programming pulses. Thus, in subsequent programming cycles, only cells which have not reached their target programming state, may continue to receive programming pulses until each cell has reached its respective target program state. Algorithms for programming MLC cells are known. U.S. patent application Ser. No. 10/354,050, filed on Jan. 30, 2003, assigned to the same assignee as the present invention, teaches several programming algorithms for MLC memory arrays. The specification of U.S. patent application Ser. No. 10/354,050, is hereby incorporated by reference in its entirety into the present application. Any programming algorithm, presently known or to be devised in the future, is applicable to the present invention.

There is a need in the field of semiconductors for improved systems, circuits and methods for the programming of NVM cells and more particularly for programming MLC's.

SUMMARY OF THE INVENTION

According to some embodiments of the present invention, a multi-level cell ("MLC") memory array may be programmed using a programming circuit having a binary input register to store binary data to be input into the MLC array and a register to store a programming vector, where each element in the programming vector corresponds to an MLC in the array. A controller may map pairs of bits from the input register to elements in the programming vector, such that mapping a pair of bits to an element of the programming vector may set the vector element to a "program" value if the pair of bits corresponds to a specific program state or set of program states associated with the programming vector.

According to some embodiments of the present invention, a programming vector may be associated with only one program level or state, while in other embodiments of the present invention, a programming vector may be associated with two or more program levels or states.

As part of some embodiments of the present invention, the controller may map pairs of bits to a second programming vector associated with a second program state. Furthermore, a separate programming vector may be mapped for each program state of the MLC.

According to some further embodiments of the present invention, the controller may apply programming pulses to each MLC in the array corresponding to vector elements whose values are set at a "program" value. The controller may reset each element of a vector to a "do-not-program" value once the MLC corresponding to the vector element has been fully programmed to the program state with which the given programming vector is associated.

According to some embodiments of the present invention, each MLC may include multiple charge storage regions (e.g. dual bit NROM cell). In cases where an MLC array is comprised of cells having multiple charge storage regions, each charge storage region may be treated as a single MLC.

In some embodiments of the present invention, the controller only maps one programming vector at a time. In other embodiments of the present invention, the controller may map multiple programming vectors, where each vector is associated with a specific program state. However, in further embodiments of the present invention, a programming vector may be associated with more than one program state. In one embodiment of the present invention, a programming vector may be associated with a first programming state and may be further associated with one or more higher programming states corresponding to higher programming levels (or threshold voltages).

In some embodiments of the present invention, the controller may apply programming pulses to the MLC array using only one programming vector at a time. In other embodiments of the present invention, the controller may apply programming pulses to the MLC array using multiple programming vectors at the same time, where each vector is associated with a different program level or different set of program levels. In some embodiments of the present invention, when an MLC reaches a target program state during programming, the MLC's corresponding programming vector element may be reset to a "do-not-program" value.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1A:
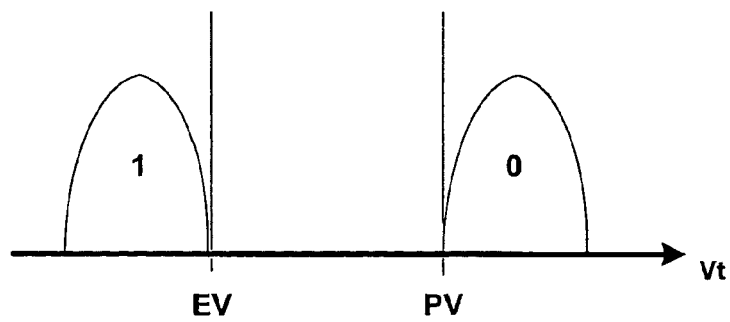
FIG. 1A shows a voltage distribution graph depicting possible threshold voltage distributions in the charge storage region of a binary non-volatile memory cell, wherein vertical lines depict boundary values correlated with each of the cell's possible program states.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods and procedures have not been described in detail so as not to obscure the present invention.

In the field of Multi Level Cells (MLCs), the "11" state of an MLC is sometimes used to described the erased state of the MLC. However, for the purposes of illustration, with reference to some embodiments of the present invention, throughout the specification and the claims of the present invention, the "11" state of an MLC and similar terms may be used to describe a program state of an MLC. It should be noted, that the use of the term "11" to describe a program state of an MLC is for illustration purposes only, and is not intended to limit the scope of the present application, nor to surrender or limit any subject matter whatsoever.

According to some embodiments of the present invention, a multi-level cell ("MLC") memory array may be programmed using a programming circuit having a binary input register to store binary data to be input into the MLC array and a register to store a programming vector, where each element in the programming vector corresponds to an MLC in the array. A controller may map pairs of bits from the input register to elements in the programming vector, such that mapping a pair of bits to an element of the programming vector may set the vector element to a "program" value if the pair of bits corresponds to a specific program state associated with the programming vector.

According to some embodiments of the present invention, a programming vector may be associated with only one program level or state, while in other embodiments of the present invention, a programming vector may be associated with two or more program levels or states.

As part of some embodiments of the present invention, the controller may map pairs of bits to a second programming vector associated with a second program state. A separate programming vector may be mapped for each program state of the MLC. However, in further embodiments of the present invention, a programming vector may be associated with more than one program state. In one embodiments of the present invention a programming vector may be associated with a first programming state and may be further associated with one or more higher programming states corresponding to higher programming levels (or threshold voltages).

According to some further embodiments of the present invention, the controller may apply programming pulses to each MLC in the array corresponding to vector elements whose values are set at a "program" value. The controller may reset each element of a vector to a "do-not-program" value once the MLC corresponding to the vector element has been fully programmed to the program state with which the given programming vector is associated.

In some embodiments of the present invention, the controller only maps one programming vector at a time. In other embodiments of the present invention, the controller may map multiple programming vectors, where each vector is associated with a specific program state.

According to some embodiments of the present invention, each MLC may include multiple charge storage regions (e.g. dual bit NROM cell). In cases where an MLC array is comprised of cells having multiple charge storage regions, each charge storage region may be treated as a single MLC.

In some embodiments of the present invention, the controller may apply programming pulses to the MLC array using only one programming vector at a time. In other embodiments of the present invention, the controller may apply programming pulses to the MLC array using multiple programming vectors, at the same time where each vector is associated with a different program level. In some embodiments of the present invention, when an MLC reaches a target program state during programming, the MLC's corresponding programming vector element may be reset to a "do-no-program" value.

Turning now to FIG. 1A, there is shown a voltage distribution graph depicting possible threshold voltage distributions in a charge storage region of a binary non-volatile memory cell, wherein vertical lines depict boundary values correlated with each of the cell's possible program states. A vertical line titled erase voltage ("EV") on the left side of the graph depicts the highest possible threshold voltage below which a NVM cell must be considered in an erased state (e.g. 1). A vertical line titled program voltage ("PV") on the right side of the graph depicts the lowest possible threshold voltage at which a NVM cell may be considered in a programmed state (e.g. 0). The curves in each of the regions may correspond to the actual threshold voltages at which a NVM may be while in each of the two states. The curves may be probabilistic or deterministic in nature.

Figure 1B:
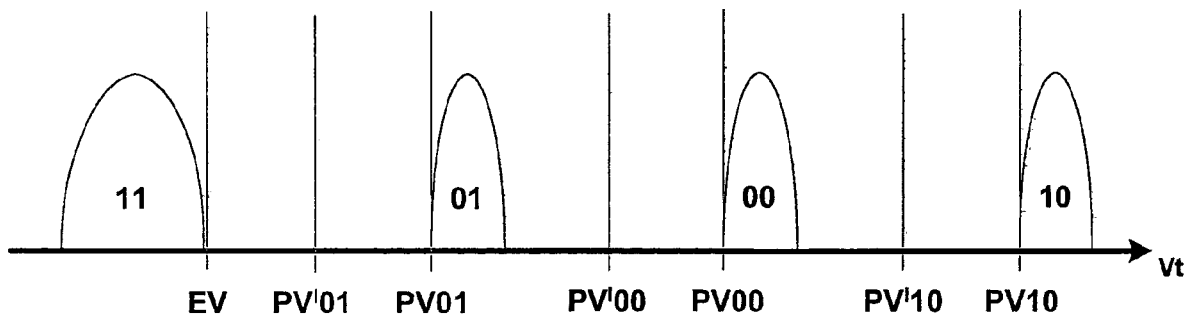
FIG. 1B shows a voltage distribution graph depicting possible threshold voltage distributions in the charge storage region of a four level non-volatile memory cell, wherein one set of vertical lines depict boundary values correlated with each of the cell's possible states, and another set depict boundary lines for "slow program" regions in front of each of the cell's program states.

Turning now to FIG. 1B, there is shown a voltage distribution graph depicting possible threshold voltage distributions in the charge storage region of a four level non-volatile memory cell, wherein one set of vertical lines depicts boundary values correlated with each of the cell's possible states (PVXX), and another set depicts boundary lines for "slow program" regions in front of each of the cell's program state (PV'XX). A vertical line titled erase voltage ("EV") on the left side of the graph depicts the highest possible threshold voltage below which a NVM cell must be considered in an erased state (e.g. "01"). The threshold voltage region between the vertical lines titled program voltage ("PV'01") and program voltage ("PV01") may represent a slow program region within which an MLC programming algorithm may continue to apply slow or small programming pulses to get the MLC into a program state (e.g. "01") associated with the program voltage PV01. Regions of the graph bound by threshold voltages defined as PV'00 and PV00, and PV'10 and PV10, define slow program regions for program states "00" and "10", respectively. The curves in each of the regions may correspond to the actual threshold voltages at which an NVM may be while in each of the two states. The curves may be probabilistic or deterministic in nature.

Figure 2:
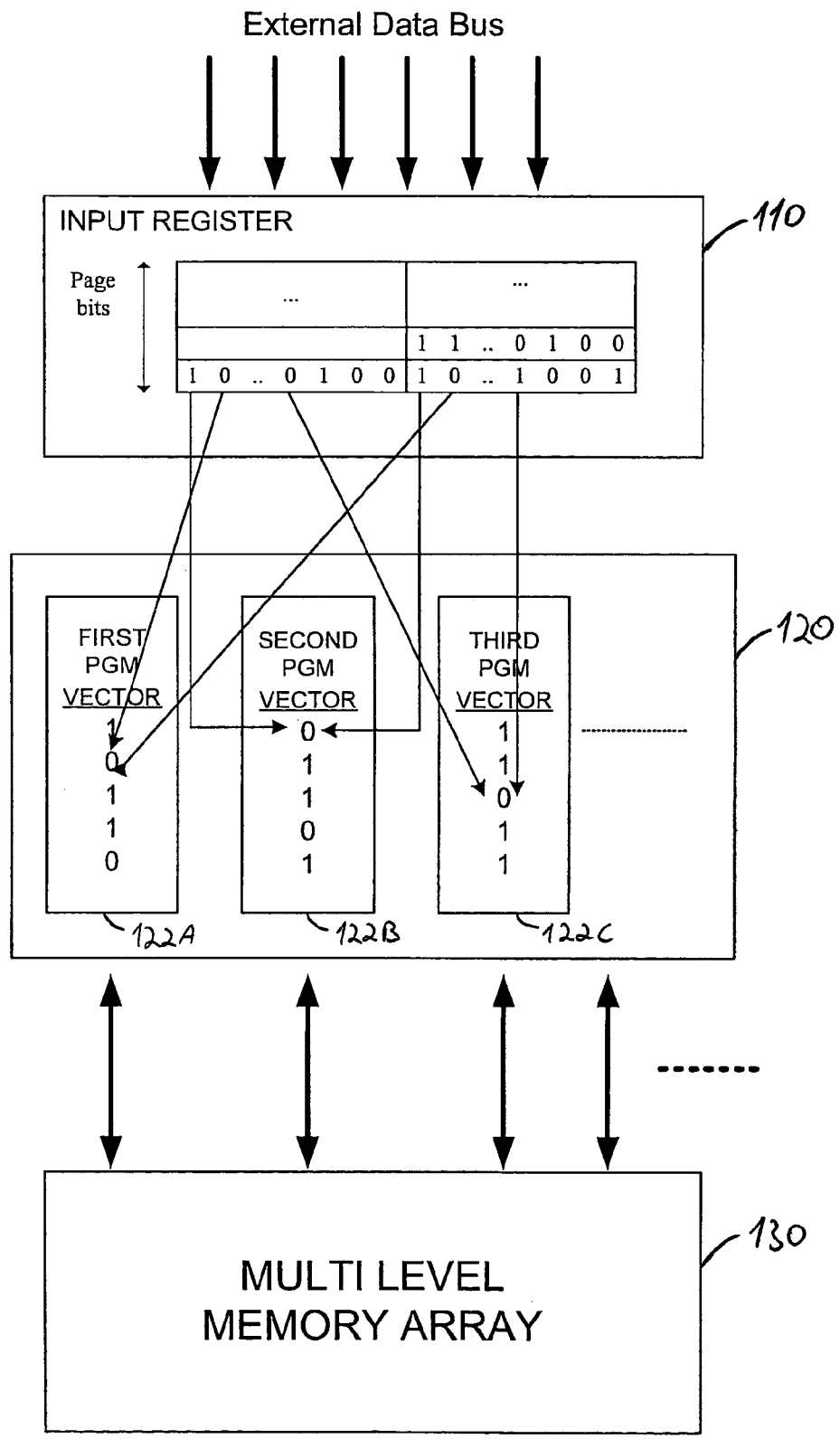
FIG. 2 shows a block diagram of an MLC programming circuit according to some embodiments of the present invention.

Turning now to FIG. 2, there is shown a block diagram of an MLC programming circuit 100, according to some embodiments of the present invention. As part of the programming circuit, there may be an input register 110 to receive data over an external data bus, which data may be programmed onto an MLC array 130. Programming vectors 122A, 122B and 122C may reside in either a second register 120 or, in some embodiments of the present invention, may reside in a portion of the input register 110.

In some embodiments of the present invention, the input register 110 may include volatile memory of a static random access memory (SRAM) or a dynamic random access memory (DRAM) architecture. In some embodiments of the present invention, the second register 120 may include volatile memory of an SRAM or DRAM architecture. Memory registers for programming NVM are well known, and any registers known today or to be devised in the future are applicable to the present invention.

Various on-chip, external and internal, data bus architectures are known. Any such architectures, known today or to be devised in the future are applicable to the present invention.

Figure 5:
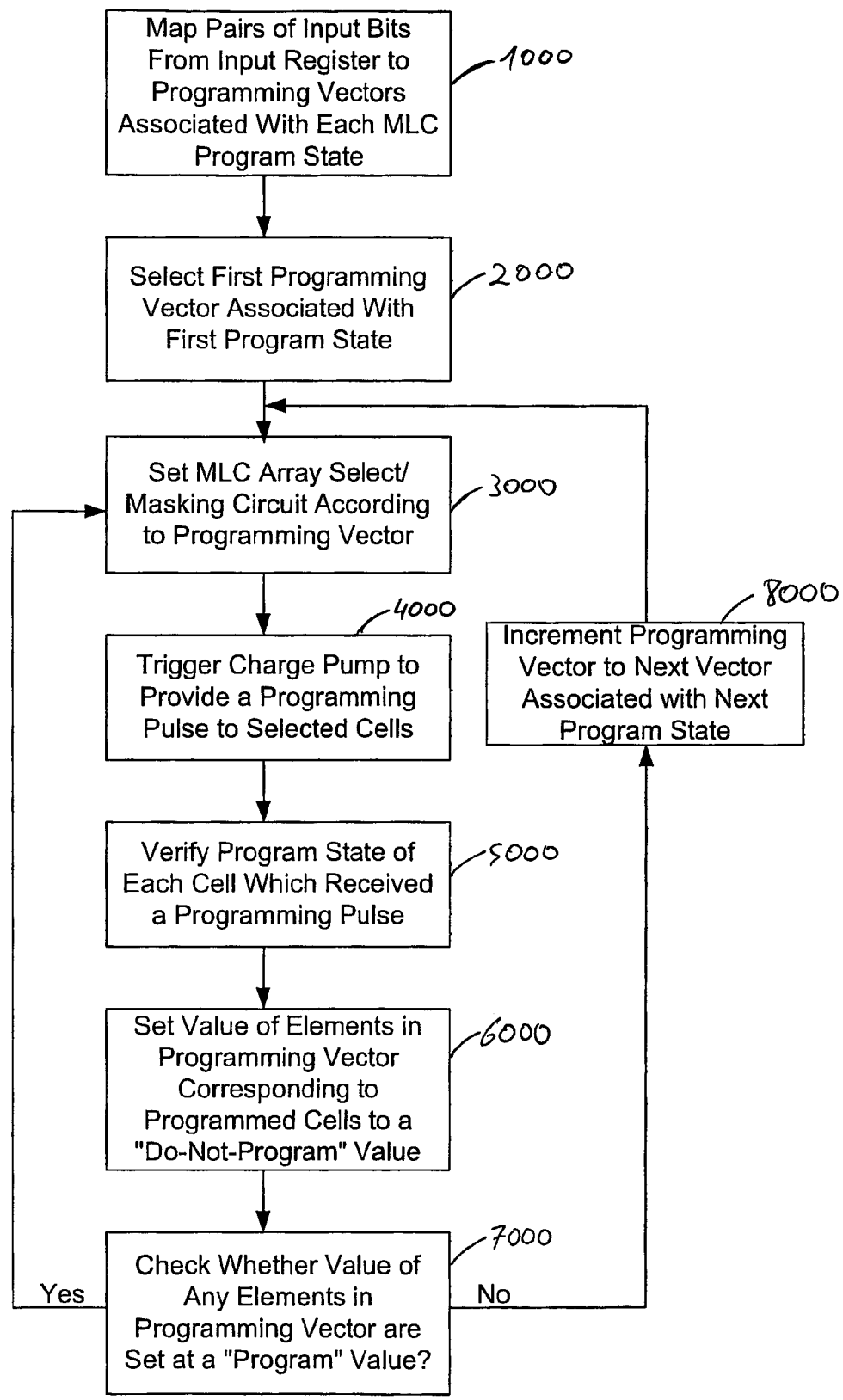
FIG. 5 shows a flow chart diagram depicting a method by which a set of MLCs may be programmed using one or more programming vectors according to some embodiments of the present invention.

As part of some embodiments of the present invention, data (e.g. pairs of bits) from the input register 110, to be stored on the MLC 130, may be first mapped onto one or more programming vectors 122, where each programming vector 122 is associated with a specific program state. Mapping of bits (e.g. pairs, three at a time, four at a time, etc. . . . ) from the input register 110 to the programming vectors 122 may be performed according to various patterns, including those exemplified in FIGS. 3A to 3C, and in accordance with various algorithms, including the algorithm exemplified in the flow diagram of FIG. 5.

Figure 3A:
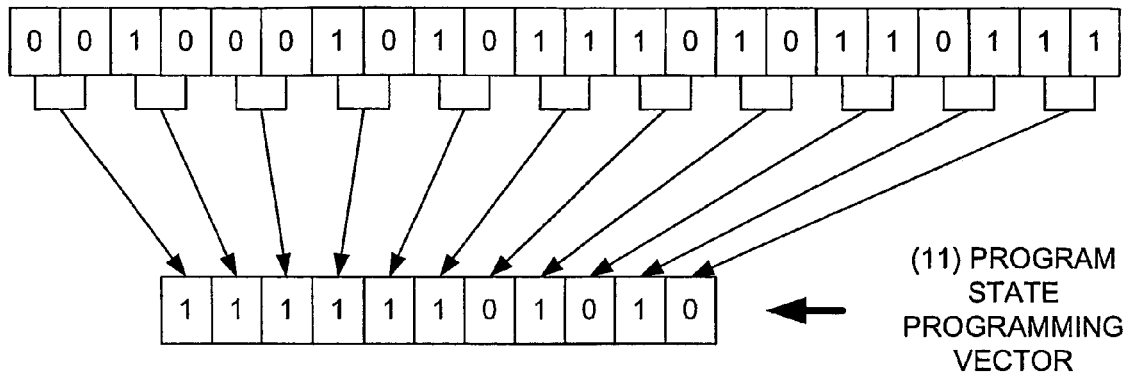
FIG. 3A shows a block diagram depicting a mapping of pairs of bits from an input register to elements of a programming vector associated with a (01) program state.

Turning now to FIG. 3A, there is shown a block diagram depicting a mapping of pairs of bits from an input register to elements of a programming vector associated with a "01" program state. For segments of data in an input register 110 to be programmed, groups of bits (e.g. pairs of bits) may be mapped from the register 110 to one or more programming vectors. Each of the programming vectors may be associated with a specific program state. Each element in the programming vector 122 may be correlated to a specific cell in an MLC array 130, and the mapping of bits from the register 110 may be such that the value of the vector element to which a pair of bits is mapped indicates whether the MLC to which the element is correlated should be programmed to a state associated with the programming vector 122. For example, in FIG. 3A, the first pair of bits on the left are mapped to a first element of programming vector 122A, where vector 122A is associated with a program state 01. Since the first pair of bits are "00" and the vector is associated with a program state "01", the first vector element is set to a "do-not-program value", which in this case is "1". However, as should be clear to those of ordinary skill in the art, either "0" or "1" may be designated as either the "program" or "do-not-program" values for a programming vector 122 and/or a programming circuit according to some embodiments of the present invention.

As further exemplified by the rightmost bit in the input register 110 of FIG. 3A, when a pair of bits is mapped to a programming vector 122 such that the logical value of the pair of bits matches the program state associated with the vector 122, the vector 122 element to which the pair is mapped is set to a "program" value, which in this example is "0".

Figure 3B:
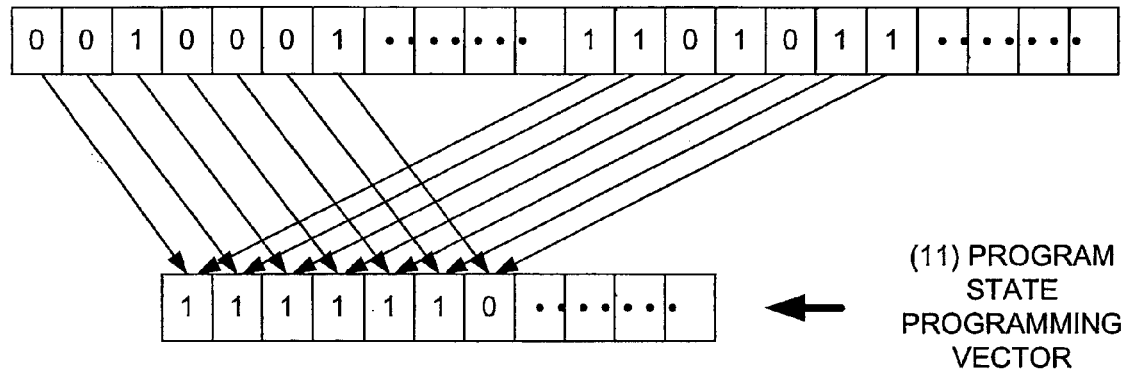
FIG. 3B shows a block diagram illustrating a mapping of pairs of bits from the same register as in FIG. 3A, wherein each bit of the pair is from a different portion of an input register, to an element of a programming vector associated with a (01) program state.

Turning now to FIG. 3B, there is shown a block diagram illustrating a mapping of pairs of bits, wherein each bit of the pair is from a different portion of an input register 110, to an element of a programming vector associated with a "01" program state. According to some embodiments of the present invention, mapping of bits from an input register 110 to a program vector 122 may be performed according to a pattern matching up bits from different portions of the register. For example, if 128 bits are mapped from a program register 110 to a 64 element (e.g. 64 bit) programming vector 122, the Nth element in the programming vector 122 bit may be a mapping from the ($N^{th}$) and ($64+N^{th}$) bits of the input register 110. In the example of FIG. 3B, the program vector is associated with a "01" program state, and thus, all pairs of bits with the logical value of "01" may result in the setting of the element to which they are mapped to be set to a "program" value (e.g. "0"). All other pairs of bits may be mapped such that elements in the programming vector 122 to which they are mapped are set to a "do-not-program" value (e.g. "1"). It will be obvious to those skilled in the art that other patterns are possible and are within the scope of the present invention.

Figure 3C:
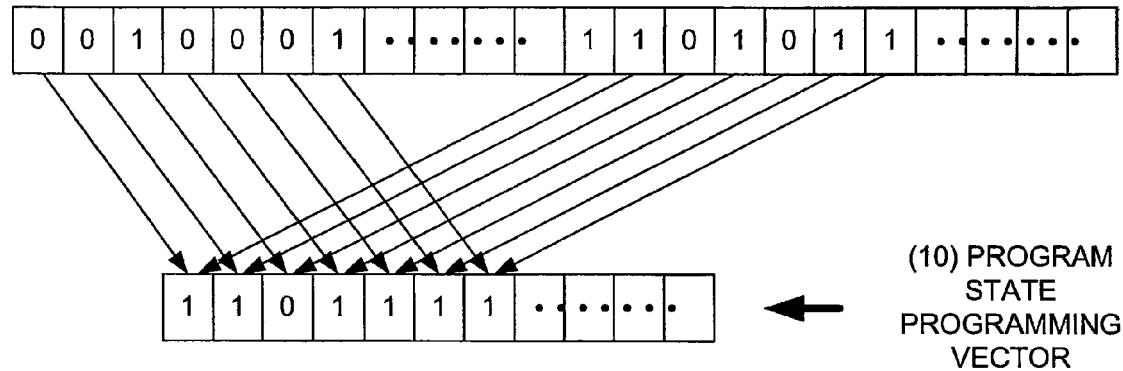
FIG. 3C shows a block diagram illustrating a mapping of pairs of bits from the same register as in FIGS. 3A & 3B, wherein each bit of the pair is from a different portion of the input register, to an element of a programming vector associated with a (10) program state.

Turning now to FIG. 3C, there is shown a block diagram illustrating a mapping of the same pairs of bits and according to the same pattern as in FIG. 3B, to elements of a programming vector associated with a "10" program state. As may be seen, because the programming vector 122B, to which the same bits as in FIG. 3B are mapped, is associated to a program state "10", the vector elements resulting from a mapping of the same source bits are different than the vector elements of FIG. 3B.

Although some embodiments of the present invention may be directed towards programming circuits utilizing programming vectors associated with a specific program state, it should be noted that the present invention is not limited in this respect, and rather, a variety of additional programming vectors may be used, in accordance with further embodiments of the present invention. For example, according to some embodiments of the present invention a programming vector may be associated with two or more program states.

According to some embodiments of the present invention a programming vector may be associated with a first program state and with a second program state. A variety of programming algorithms may be devised for utilizing such programming vectors. For instance, according to one exemplary programming algorithm, initially, cells of an MLC array to be programmed to the first program state and cells to be programmed to the second program state may receive programming pulses concurrently. After all the cells associated with each of the vector elements have been programmed to at least the first program state and all the vector elements are marked with a "Program" value, a second program vector may be generated, where elements correlated to cells to be programmed to the second, and possibly to a third program state are marked with a "Program" value. The cells associated with these elements may then be pulsed with programming pulses until each has been programmed to the second program state or level. It should be understood by one skilled in the art, that a program vector according to some embodiments of the present invention may be associated with any number of program states. A variety of additional programming algorithms utilizing programming vectors associated with two or more programming states may be devised by those of ordinary skill in the art.

Figure 4A:
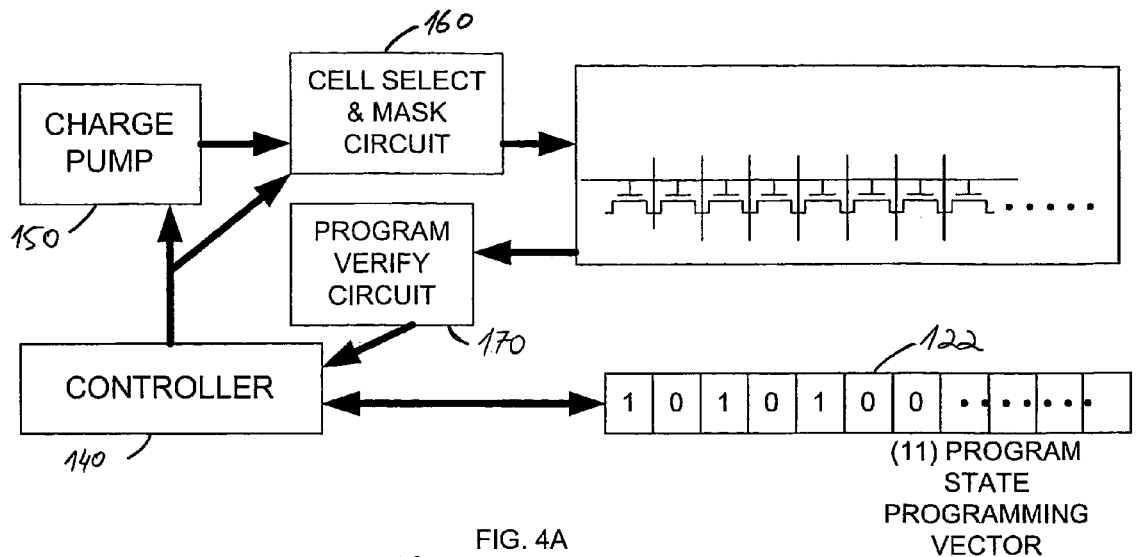
FIG. 4A shows a block diagram illustrating a portion of a programming circuit according to some embodiments of the present invention which uses a programming vector which was mapped with paired bits from an input register associated with a (01) program state in order to program the MLC associated with each of the elements in the programming vector.

Turning now to FIG. 4A, there is shown a block diagram illustrating a portion of a programming circuit, according to some embodiments of the present invention, which uses a programming vector which was mapped with grouped or paired bits form an input register associated with a "01" program state in order to program the MLC associated with each of the elements in the programming vector. The portion of the programming circuit of FIG. 4A may be explained in conjunction with a description of FIG. 5, which shows a flow chart diagram depicting the stages of a method by which a set of MLCs may be programmed.

According to stage 1000, pairs of bits from an input register may be mapped to programming vectors 122. The mapping may be done in the manner described above or according to any other pattern. As seen in FIG. 4A, each element of a programming vector 122 may correspond to an MLC in an MLC array 130. A series of bits from an input register 110 may be mapped to either one programming vector 122A at a time or to several programming vectors 122A to 122C in parallel. The controller 140 may select a programming vector 122 associated with a first programming state (stage 2000) to which cells in the MLC are to be programmed, in the example of FIG. 4A the programming vector is associated with a "01" program state.

Based on the elements of the programming vector 122, the controller may instruct a cell select and masking circuit 160 to provide a charge pump 150 with access to the MLCs corresponding to the elements of the vector 122 (stage 3000) whose values are set at a "program" value (e.g. "0"). In the example of FIG. 4A, the MLCs corresponding to the second, forth, sixth, and seventh elements of the vector 122 may be selected for programming to the program state associate with the vector 122 (e.g. "01").

Once the select circuit 160 provides access to the MLC cells corresponding to the vector elements whose values are set at a "program" state, the controller 140 may trigger the charge pump 150 (stage 4000) to produce a charging or programming pulse which may raise the threshold voltage of the selected cells to the threshold voltage associated with the programming vector "01". After the programming pulse, the controller 140 may use a program verify circuit 170 to check the program state of each of the cells which received a programming pulse (stage 5000) and may reset the value of any vector element from "program" to "do-not-program" for those elements associated with a cell that has reached the program state associated with the vector 122 (stage 6000).

Vector elements associated with cells that have not reached the target program state may be left at a "program" value, and the controller 140 may return to stage 3000 where it may instruct the cell select and mask circuit 160 to provide access to the cells needing additional charging pulses and to mask those cells which have been fully programmed. Stages 3000 to 7000 may be repeated in a loop until all the cells requiring charging have been charged to the target state and all the elements of the programming vector have been reset to a "do-not-program" value.

Figure 4B:
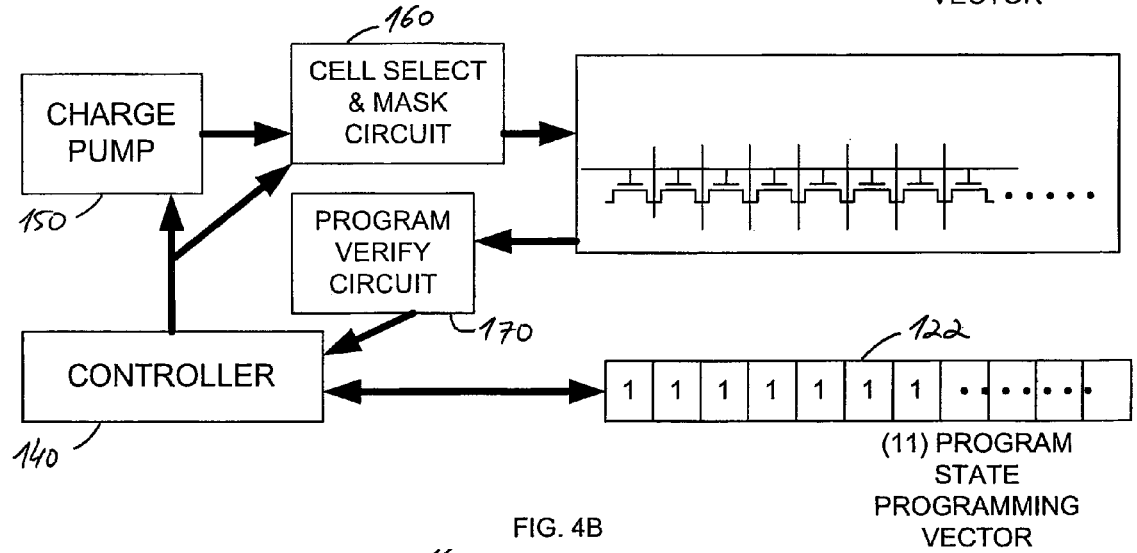
FIG. 4B shows the block diagram of the circuit of FIG. 4A, after the programming circuit has successfully programmed each of the MLCs to the (01) program state and after the circuit has set each of the elements in the programming vector to a "do-not-program" value (e.g. a value of 1)
Figure 4C:
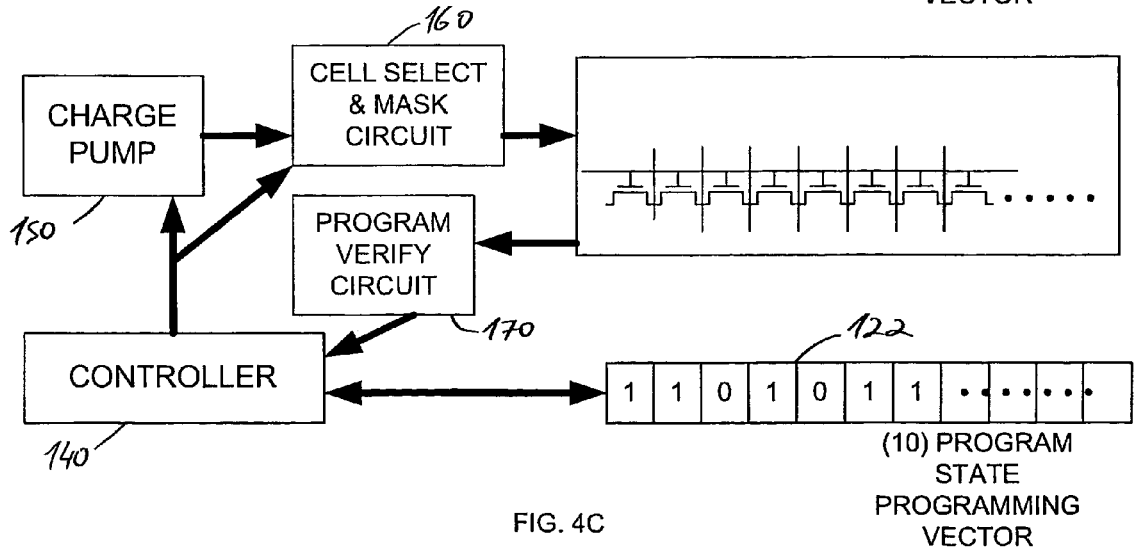
FIG. 4C shows the block diagram of the circuit of FIG. 4A, wherein the programming vector being used is associated with a (10) program state.

When the controller 140 determines at some point that all the elements in the programming vector 122 have been reset to a "do-not-program" value (stage 7000), as is exemplified in FIG. 4B, the controller 140 may proceed to use a successive program vector 122 (stage 8000). FIG. 4B, shows the block diagram of the circuit of FIG. 4A, after the programming circuit has successfully programmed each of the MLC cells to the ("01") program state and after the circuit has set each of the elements in the programming vector to a "do-not-program" value (e.g. a value of "1"). FIG. 4C shows the block diagram of the circuit of FIG. 4A, after stage 8000, wherein the programming vector 122 being used is associated with a ("10") program state, rather than the "01" program state, of FIG. 4A.

According to some embodiments of the present invention, blocks of data may be programmed onto an MLC array in data segments corresponding to a set of programming vectors, where each programming vector is associated with a specific program state. For each data segment, a set of programming vectors may be generated, and each programming vector may be used to program a corresponding set of MLCs, such that the programming vector's elements may be reset to a "do-not-program" value as corresponding MLCs complete charging. According to some embodiments of the present invention, an input register 110 used to generate the set of programming vectors may remain uncorrupted or unchanged as the MLCs are programmed.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of computing a programming vector for a multi-level cell (MLC) memory array comprising:
   mapping a first pair of bits from a binary input register to a first element in a programming vector, wherein each element in the programming vector corresponds to a single charge storage region of an MLC in said memory array.

2. The method according to the claim 1, further comprising mapping a second pair of bits from a binary input register to a second element in a programming vector.

3. The method according to claim 2, wherein successive and adjacent elements in the vector each correspond to successive and adjacent MLC charge storage regions, and the vector is associated with at least one specific program state.

4. The method according to claim 3, wherein mapping a pair of bits to an element of the programming vector comprises setting the element to a "program" value if the pair of bits corresponds to the at least one specific program state with which the programming vector is associated.

5. The method according to claim 4, wherein mapping a pair of bits to an element of said programming vector comprises setting the element to a "do-not-program" value if said pair of bits does not correspond to the at least one specific program state with which the programming vector is associated.

6. The method according to claim 3, wherein the vector is associated with each of two or more specific program states.

7. The method according to claim 6, wherein the two or more specific program states comprise at least a first program state and a second program state, wherein the second program state is associated with a higher threshold voltage than the first program state.

8. A method of programming a multi-level cell ("MLC") memory array comprising:
   mapping a first pair of bits from a binary input register to a first element in a programming vector, wherein each element in the programming vector corresponds to a single charge storage region of an MLC in said array.

9. The method according to the claim 8, further comprising mapping a second pair of bits from a binary input register to a second element in a programming vector.

10. The method according to claim 9, wherein successive and adjacent elements in the vector each correspond to successive and adjacent MLC charge storage regions, and the vector is associated with at least one specific program state.

11. The method according to claim 10, wherein mapping a pair of bits to an element of the programming vector comprises setting the element to a "program" value if the pair of bits corresponds to the at least one specific program state with which the programming vector is associated.

12. The method according to claim 11, wherein mapping a pair of bits to an element of the programming vector comprises setting the element to a "do-not-program" value if the pair of bits does not correspond to the at least one specific program state with which the programming vector is associated.

13. The method according to claim 12, further comprising applying a programming pulse to each MLC charge storage region in the array corresponding to a vector element whose value is set at a "program" value.

14. The method according to claim 13, further comprising setting a vector element value to "do-not-program" once the MLC charge storage region corresponding to the element is programmed to the state with which the programming vector is associated.

15. The method according to claim 14, further comprising mapping a first pair of bits from the binary input register to elements of a second programming vector associated with a second program state and wherein mapping a pair of bits to an element of the second programming vector comprises setting the element to a "program" value if the pair of bits corresponds to the second program state with which the second vector is associated.

16. The method according to claim 10, wherein the vector is associated with each of two or more specific program states.

17. The method according to claim 16, wherein the two or more specific program states comprise at least a first program state and a second program state, wherein the second program state is associated with a higher threshold voltage than the first program state.

18. A multi-level cell ("MLC") memory array programming circuit comprising:
   a binary input register to store data to be input into an MLC array;
   a register to store a programming vector, where each element in the programming vector corresponds to a charge storage region of an MLC in the array; and
   a controller to map a first pair of bits from said input register to a first element in the programming vector.

19. The circuit according to the claim 18, wherein said controller maps a second pair of bits from said binary input register to a second element in the programming vector.

20. The circuit according to claim 19, wherein successive and adjacent elements in the vector each correspond to successive and adjacent MLC charge storage regions, and the vector is associated with at least one specific program state.

21. The circuit according to claim 20, wherein said controller maps a pair of bits to an element of the programming vector by setting the element to a "program" value if the pair of bits corresponds to the at least one specific program state with which the programming vector is associated.

22. The circuit according to claim 20, wherein said controller maps a pair of bits to an element of the programming vector by setting the element to a "do-not-program" value if the pair of bits does not correspond to the at least one specific program state with which the programming vector is associated.

23. The circuit according to claim 21, wherein said controller applies a programming pulse to each MLC charge storage region in the array corresponding to a vector element whose value is set at a "program" value.

24. The circuit according to claim 23, wherein said controller sets a vector element value to "do-not-program" once the MLC corresponding to the element is programmed to the at least one program state with which the programming vector is associated.

25. The circuit according to claim 24, wherein said controller maps pairs of bits from said binary input register to the elements of a second programming vector associated with a second program state and wherein mapping a pair of bits to an element of the second programming vector comprises setting the element to a "program" value if the pair of bits corresponds to the second program state with which the second vector is associated.

26. The circuit according to claim 20, wherein the vector is associated with each of two or more specific program states.

27. The circuit according to claim 26, wherein the two or more specific program states comprise at least a first program state and a second program state, wherein the second program state is associated with a higher threshold voltage than the first program state.

* * * * *